United States Patent [19]

Shporer

[11] Patent Number: 5,332,967
[45] Date of Patent: Jul. 26, 1994

[54] WELL LOGGING TOOL FOR BORE HOLE INVESTIGATIONS

[75] Inventor: Mordechai Shporer, Rehovot, Israel

[73] Assignee: Bruker Analyitische Messtechnik GmbH, Fed. Rep. of Germany

[21] Appl. No.: 59,209

[22] Filed: May 7, 1993

[30] Foreign Application Priority Data

May 11, 1992 [DE] Fed. Rep. of Germany ....... 4215454

[51] Int. Cl.$^5$ .............................................. G01R 33/20
[52] U.S. Cl. ...................................... 324/303; 324/300
[58] Field of Search ................ 324/303, 300, 318; 128/653.5, 653.2

[56] References Cited

U.S. PATENT DOCUMENTS

| | | | |
|---|---|---|---|
| 3,617,867 | 11/1971 | Herzog | 324/303 |
| 4,717,877 | 1/1988 | Taicher et al. | 324/303 |
| 5,280,243 | 1/1994 | Miller | 324/303 |

FOREIGN PATENT DOCUMENTS

0237323 3/1987 European Pat. Off. .

Primary Examiner—Michael J. Tokar
Assistant Examiner—Raymond Y. Mah
Attorney, Agent, or Firm—Cesari and McKenna

[57] ABSTRACT

The invention concerns a nuclear resonance well logging tool for insertion into a borehole with a permanent magnet which is magnetized perpendicularly to its axis and with means to transmit and to detect high frequency signals whereby the transmission and detection coils are orthogonal. The arrangement is configured for CW operation. The permanent magnet or the transmission and detection coil arrangement may rotate around the axis in order to modulate the nuclear resonance signals.

18 Claims, 5 Drawing Sheets

WELL LOGGING TOOL FOR BORE HOLE INVESTIGATIONS

FIELD OF THE INVENTION

The invention concerns a well logging tool for insertion into a bore hole with an elongated cylinder-shaped permanent magnet which is magnetized perpendicularly to its axis, to produce a static magnetic field outside the bore hole, which in an axial range is directed essentially perpendicular to the cylinder axis and whose magnitude in this range depends essentially only on the radial distance from the axis, with at least one high frequency transmission and/or detection coil to transmit and/or to detect high frequency signals for the excitation and/or the detection, respectively, of proton nuclear resonance signals in material outside the bore hole, whereby the high frequency magnetic field which is produced by the transmission coil comprises components which are inside that range perpendicular to the cylinder axis as well as to the static magnetic field.

DESCRIPTION OF THE PRIOR ART

Such a well logging tool is for example known from U.S. Pat. No. 4,717,877. The known well logging tool makes use of the fact that the magnetic field of an elongated cylinder which is magnetized perpendicularly to its axis is, apart from effects at the end portions of the cylinder, directed perpendicular to the cylinder axis and that its magnitude depends only on the radial distance from the cylinder axis. An elongated combined transmission and detection coil is used for the high frequency whose normal vector is perpendicular to the cylinder axis as well as to the direction of the magnetization of the permanent magnet. As a consequence, the high frequency magnetic field emitted from this high frequency coil is in large ranges outside the bore hole to a good approximation perpendicular to the static magnetic field produced by the permanent magnet which represents an optimum configuration for the production of high frequency signals. In the surrounding material the protons are excited by high frequency pulses and subsequently either a spin echo signal or the signal arising from their free precession in the magnetic field of the permanent magnet is detected.

In oil well logging by means of nuclear resonance probes the objective is to examine the rock formation surrounding the well bore. A magnet consisting of a long cylinder magnetized perpendicularly to its axis generates in its vicinity a magnetic field whose characteristics particularly suit requirements for well logging. The main features of such a magnetic field are:

1. The magnitude of the magnetic field at a given radial distance from the cylinder axis is given by:

$$B_0(r) = \tfrac{1}{2} B_0(r<a) * (a/r)^2$$

whereby $B_0(r<a)$ is the magnetic flux density inside the magnet, a is the radius of the magnet and r is the distance of the point of interest from the cylinder axis.

2. The gradient of the magnetic field in the radial direction is given by the following expression:

$$dB_0/dr = -B_0(r<a) * a^2/r^3$$

3. If, at a given radial distance from the cylinder axis, one moves on a circular trajectory around this axis, the magnetic field strength remains constant, but the direction of the magnetic field is rotated twice with respect to the direction of the magnetization.

If outside the bore hole in the vicinity of the well logging tool there is material which contains protons, a high frequency pulse in the coil excites within a cylindrical shell the nuclear moments whose Larmor frequency matches the high frequency of the pulse. The diameter of the cylindrical shell depends on the high frequency and its thickness on the high frequency bandwidth. Usually ferrite permanent magnets of about 150 cm length and 15 cm diameter are employed. The high frequency is about 1 MHz and a cylindrical shell with a diameter of about 35 cm is excited.

An essential requirement for any nuclear resonance probe for bore holes is that measurements can also be performed while the probe is moving upwards. A well logging tool limited to stationary measurements or to measurements with very slow motion is largely useless. The above mentioned probe for pulse measurements has the following drawbacks which limit its use to very slow velocities.

1. The thickness of the cylindrical shell which dictates the amount of investigated material depends on the bandwidth of the high frequency pulse. However, if pulse technique is used, the bandwidth is closely related to the possible strength of the high frequency field. Since the high frequency signals are absorbed in the surroundings and since the environment of the probe creates unfavourable conditions, technical difficulties arise limiting the high frequency field strength which reaches the cylindrical shell, eventually resulting in a very thin excited shell, leading, as a consequence, to a bad signal to noise ratio. This, in turn, requires averaging over very many measurements, limiting the speed of the probe.

Apart from these technical difficulties there is, however, a far more basic physical phenomenon, related to the pulse technique and further limiting the possibilities to increase the speed of the well logging tool. During the upward movement of the well logging tool in an uncased bore hole it is impossible to avoid small sidewise tilts or shifts of the probe. A sidewise shift of the magnet, however, generates magnetic field alterations at the site of the excited cylindrical shell which, in turn, causes phase shifts in the precessing nuclear magnetization. Due to the symmetry of the assembly, the phase shifts have opposite signs at opposite sides of the probe. Because of the minimum pulse width and unavoidable dead times after the high frequency pulse, the time interval between the pulses has to be at least some milliseconds. A quantitative analysis reveals that phase shifts due to sidewise motions of a few micrometers during such a pulse sequence cause significant distortions of the signal height and may even lead to a complete disappearance of the signal. Sidewise tilts of such an order of magnitude are, however, unavoidable under the minimum speed requirements for these measurements. For these reasons, the possibilities to use well logging tools with the above mentioned geometrical setup have so far remained very limited.

It is therefore the aim of the invention to improve a well logging tool of the above mentioned kind in such a way that reliable measurements are also possible if the probe is moved.

BRIEF SUMMARY OF THE INVENTION

This aim is achieved by the invention by the use of transmission and detection coils which are mutually inductively decoupled and by the presence of means to apply to the transmission coil a CW high frequency excitation current with the Larmor frequency of the nuclei of material at a predetermined distance from the cylinder axis. In this way, the aim underlying the invention is completely achieved, since in a CW excitation the high frequency power is applied continuously, thus reducing very strongly the technical requirements for a broad band excitation. Moreover the CW method is not sensitive to sidewise tilts or shifts.

In a preferred embodiment of the invention the permanent magnet can be rotated around its axis radially inside the high frequency coils, effecting a modulation of the nuclear resonance signal detected by the detection coil with twice the rotation frequency of the permanent magnet.

This measure has the advantage that the detected nuclear resonance signal may be detected in a frequency selective and phase sensitive manner with respect to twice the rotation frequency of the permanent magnet, thus considerably improving the signal to noise ratio.

In a preferred version of this embodiment the rotation of the magnet is effected by applying a low frequency AC current to both orthogonal coils.

This measure has the advantage that no additional drive means are necessary.

Further advantages are apparent from the description and the accompanying figures.

Clearly, the features that have been described above and will be explained hereafter can be used not only in the described combination but also in any other combination or individually without departing from the scope of the present invention.

It is shown in:

BRIEF DESCRIPTION OF THE DRAWING

FIG. 1b a side view of the permanent magnet and the high frequency coil according to FIG. 1a;

DETAILED DESCRIPTION OF THE PREFERRED EMBODIMENTS

Figure 1A:
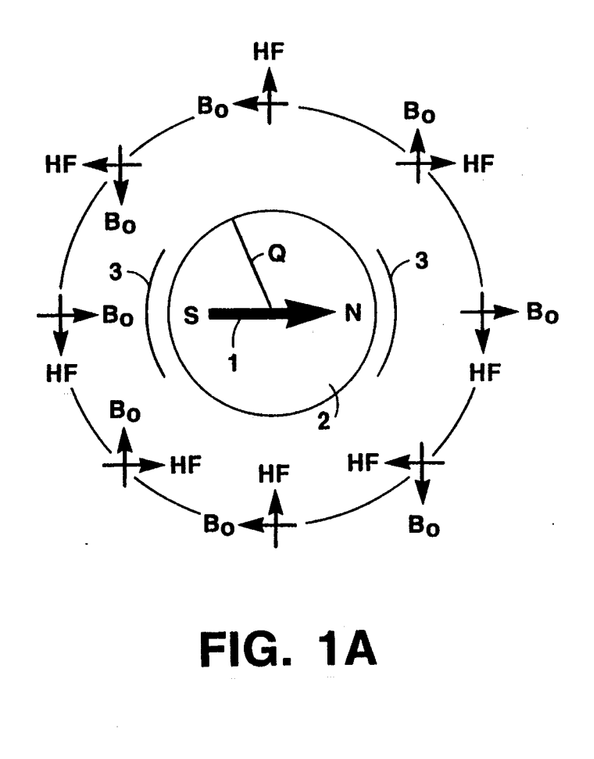
FIG. 1a a schematic top view of the permanent magnet and the high frequency coil of a well logging tool according to the prior art.

In detail, FIG. 1a shows in a top view along its axis an elongated cylinder-shaped permanent magnet (2) which is magnetized perpendicularly to its axis as well as the combined high frequency transmission and detection coil (3) of a pulse NMR well logging tool of prior art. The magnetization direction of the permanent magnet (2) is indicated by a horizontal arrow. It is assumed that the entire volume of the permanent magnet is homogeneously magnetized. The high frequency coil (3) is also elongated along axis (1) and can for example surround the permanent magnet completely in a free-like manner. In order to have defined magnetic field conditions inside the sensitivity range of the high frequency coil, the permanent magnet may also project axially beyond the ends of the coil. For a number of positions at distance r from the axis (1), the directions of the static magnetic field ($B_0$) produced by the permanent magnet and of the high frequency magnetic field (RF) produced by the high frequency coil (3) are each indicated by arrows. For elongated permanent magnetic cylinders and for likewise axially elongated high frequency coil, the magnitudes of these fields are each to a good approximation independent of the position at the radius r and they are mutually perpendicular to each other. This is the optimum configuration in order to excite by the high frequency field a precession of the nuclear spins around the static magnetic field and to subsequently detect the nuclear spin resonance signals caused by this precession.

Figure 1B:
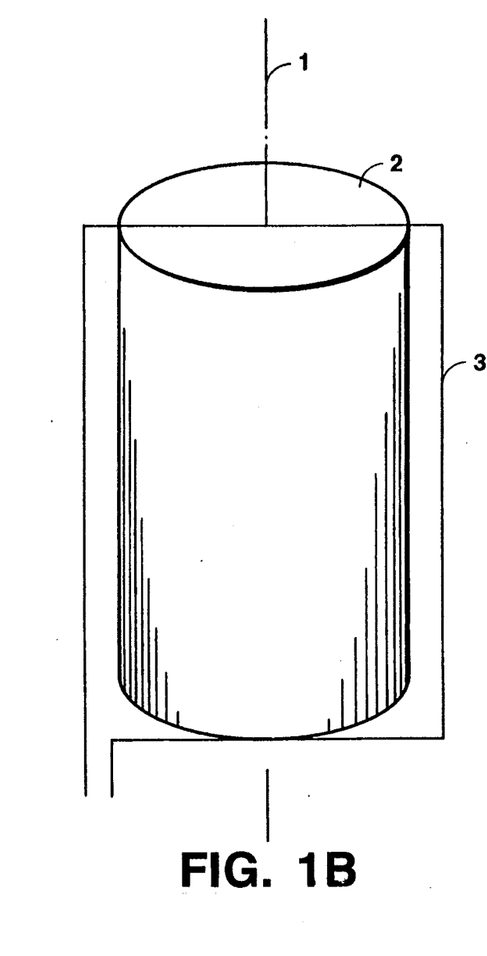

FIG. 1b shows the arrangement of FIG. 1a in a side view. In this configuration one tolerates in the vicinities of the axial ends of the permanent magnet and of the high frequency coil deviations from the idealized field configuration, represented in FIG. 1a.

Figure 2:
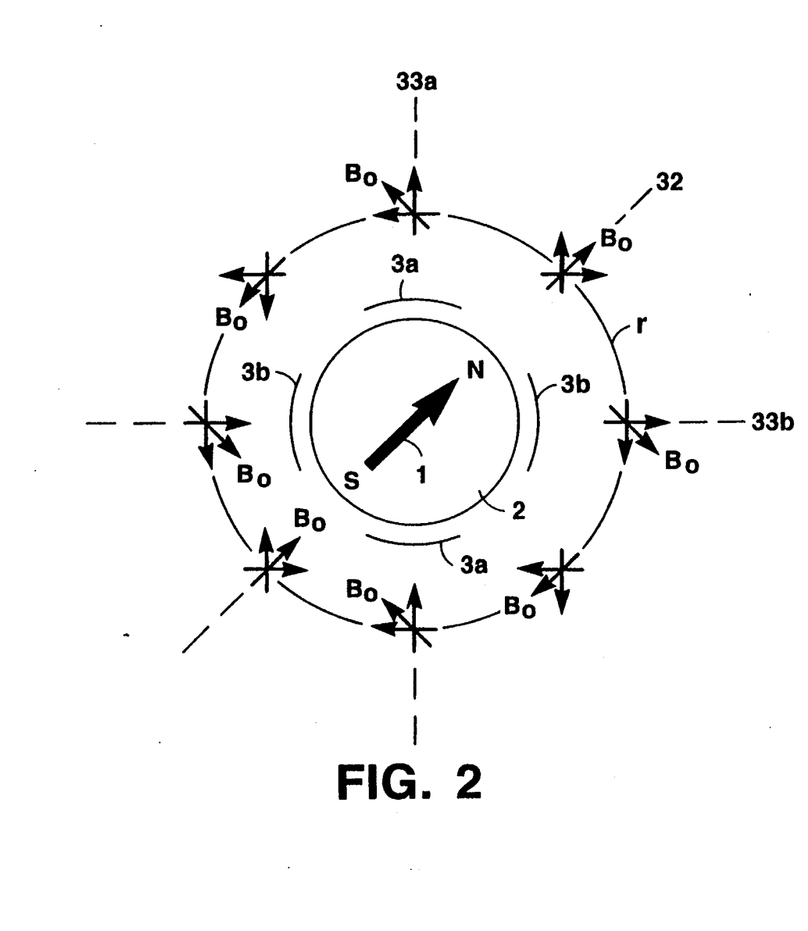
FIG. 2 a top view of the permanent magnet as well as the transmission and detection coil of a well logging tool according to the invention.

FIG. 2 shows in a top view the permanent magnet (2), the high frequency transmission coil (3a) and the high frequency detection coil (3b) of a nuclear resonance well logging tool according to the invention. The arrangement corresponds largely to that of FIG. 1a. However, transmission and detection coils are separated and are perpendicular to each other with their normal vectors so that they are inductively decoupled from each other. Hence, a high frequency current through the transmission coil (3a) does not directly cause an induced high frequency signal in the detection coil (3b). For a fixed radius r, the relative orientations of the high frequency magnetic fields produced by the transmission or detection coil, respectively, are indicated by arrows. Within the framework of the approximations already mentioned above, these are mutually perpendicular to each other independent of the position. In an embodiment of the invention, the magnetization axis of the permanent magnet (2) is fixed at 45° (direction 32 in FIG. 2) with respect to both normal vectors (33a,b) of the transmission and detection coil and perpendicular to the cylinder axis (1). As a consequence, the static magnetic field ($B_0$) produced by this magnet (2) is also at each position at 45° with respect to both high frequency magnetic fields. This implies that a nuclear spin resonance signal is excited by the transmission coil with an efficiency reduced by the factor $1:\sqrt{2}$, and that a nuclear spin resonance signal of the nuclear moments precessing about the static magnetic field is detected by the detection coil with an amplitude also reduced by the factor $1:\sqrt{2}$.

This is the optimum configuration for a setup with orthogonal transmission and detection coils. If a CW high frequency current of a certain frequency bandwidth is continuously applied to the transmission coil (3a), nuclear resonance is permanently excited in a cylinder shell whose thickness is proportional to the bandwidth. The detection coil (3b) which is decoupled from the transmission coil (3a) detects in turn a signal within this frequency band which arises from the hydrogen nuclei of the cylindrical shell surrounding the bore hole. Since there is continuous excitation and since, as a result, there is no time interval between excitation pulse and detected signal, the method is insensitive to radial shifts of the measuring probe. Moreover, the bandwidth may be considerably larger compared to pulse excitation since with CW excitation the high peak power for a broad band excitation pulse is not necessary.

In a preferred embodiment of the invention, the permanent magnet (2) rotates around axis (1) in relation to the transmission and detection coil configuration (3a,b). Preferably, magnet (2) rotates and the coil configuration (3a,b) remains stationary. However, generally also the coil system (3a,b) can rotate and the magnet (2) stays stationary. The amplitude of the momentarily detected nuclear resonance signal depends on the relative position of the magnet (2) with respect to the axes (33a,b) of the magnet coil configuration (3a,b). If the magnetization direction (32) of the magnet (2) coincides with that of the transmission coil system (3a) (vertical in FIG. 2), no nuclear spins are excited to a good approximation. If the magnetization direction (32) of the magnet (2) coincides with the axis of the detection coil system (3b) (horizontal in FIG. 2), the nuclear spins are in fact excited but no nuclear resonance signal is detected to a good approximation. The maximum signal is obtained if the magnetization direction (32) of magnet (2) is at 45° between the axes (33a,b) of the transmission and detection coil systems (3a,b). With continuous excitation and rotating magnet (2) the detected measuring signal will therefore be modulated, in fact with twice the rotation frequency. The rotation frequency is small compared to the high frequency. The modulated high frequency signal may be detected in a narrow banded and phase sensitive manner by means of a lock-in amplifier, thus improving the signal to noise ratio.

Figure 3:
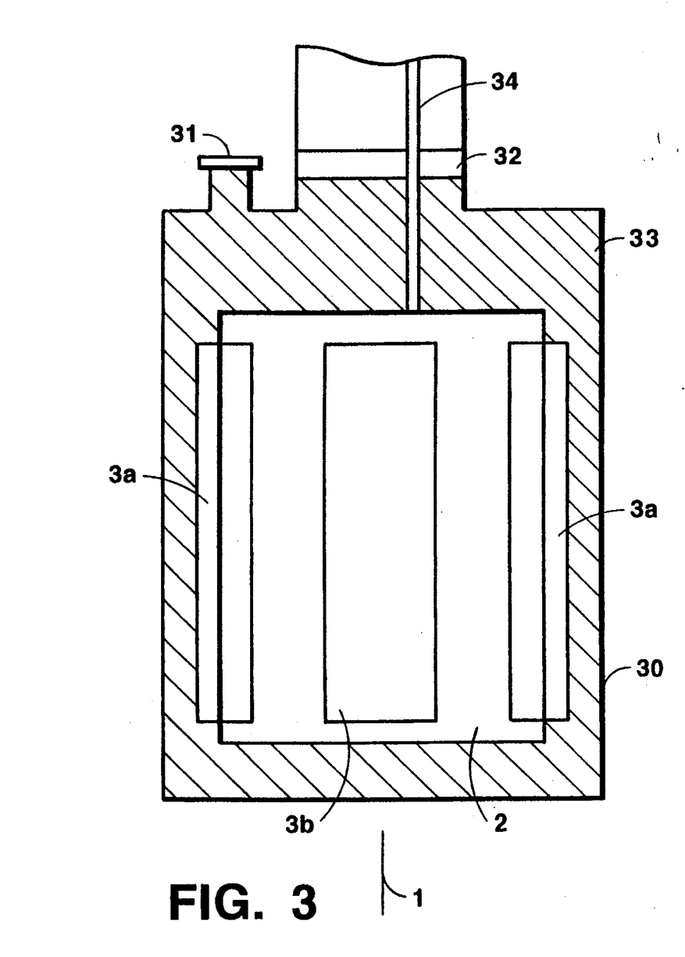
FIG. 3 a cross section of an embodiment of a well logging tool according to the invention.

FIG. 3 shows schematically the cross section of a nuclear resonance well logging tool in a plane containing axis (1). The permanent magnet (2) is surrounded by the orthogonal transmission (3a) and detection coil (3b) configurations. They are located inside the essentially cylinder-shaped probe housing (30) of the well logging tool together with the further components which are described in connection with FIGS. 5 and 6. The interior of the housing is filled with a fluid (33) and pressure equilibrium with the surroundings, i.e. the bore hole fluid, can be achieved via a membrane (31). The well logging tool is closed on top with a cover (32) with feedthroughs (34), comprising e.g. electrical or optical lines or power leads.

Figure 4:
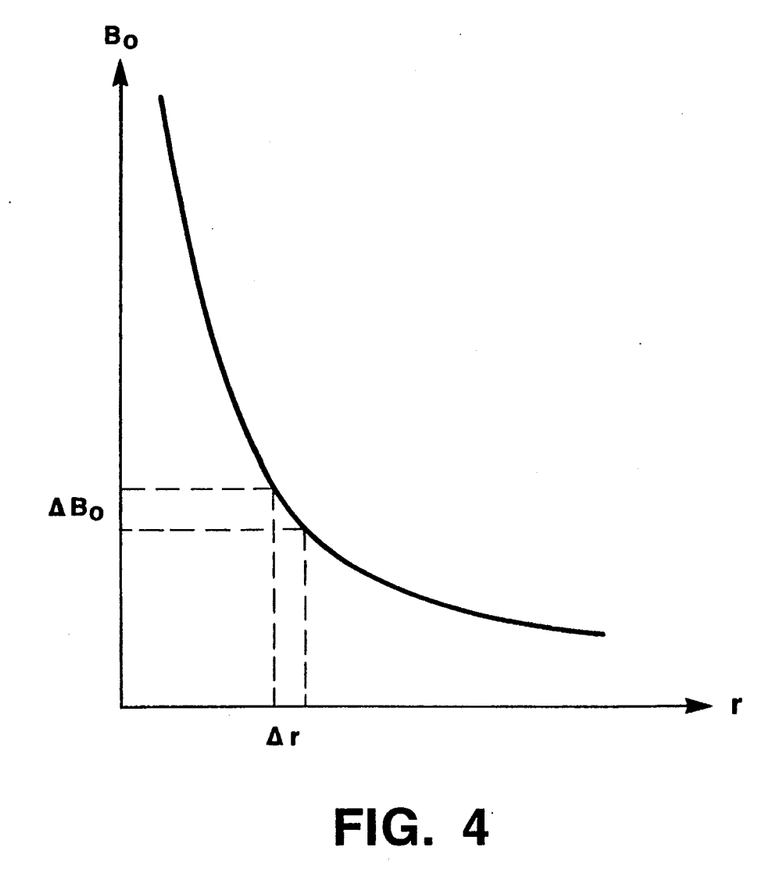
FIG. 4 the dependence of the magnetic field strength on the distance r from the axis of the permanent magnet.

FIG. 4 represents graphically the radial dependence of the magnetic field strength ($B_0$) on the distance (r) from the axis (1). In order to clarify the considerable field strength variation for small shifts, dashed lines are drawn for two radial positions. If the homogeneously magnetized cylinder-shaped permanent magnet (2) has the radius a, the following formula results for r>a:

$$B_0 = B_0(r<a)/2 * (a/r)^2.$$

Figure 5:
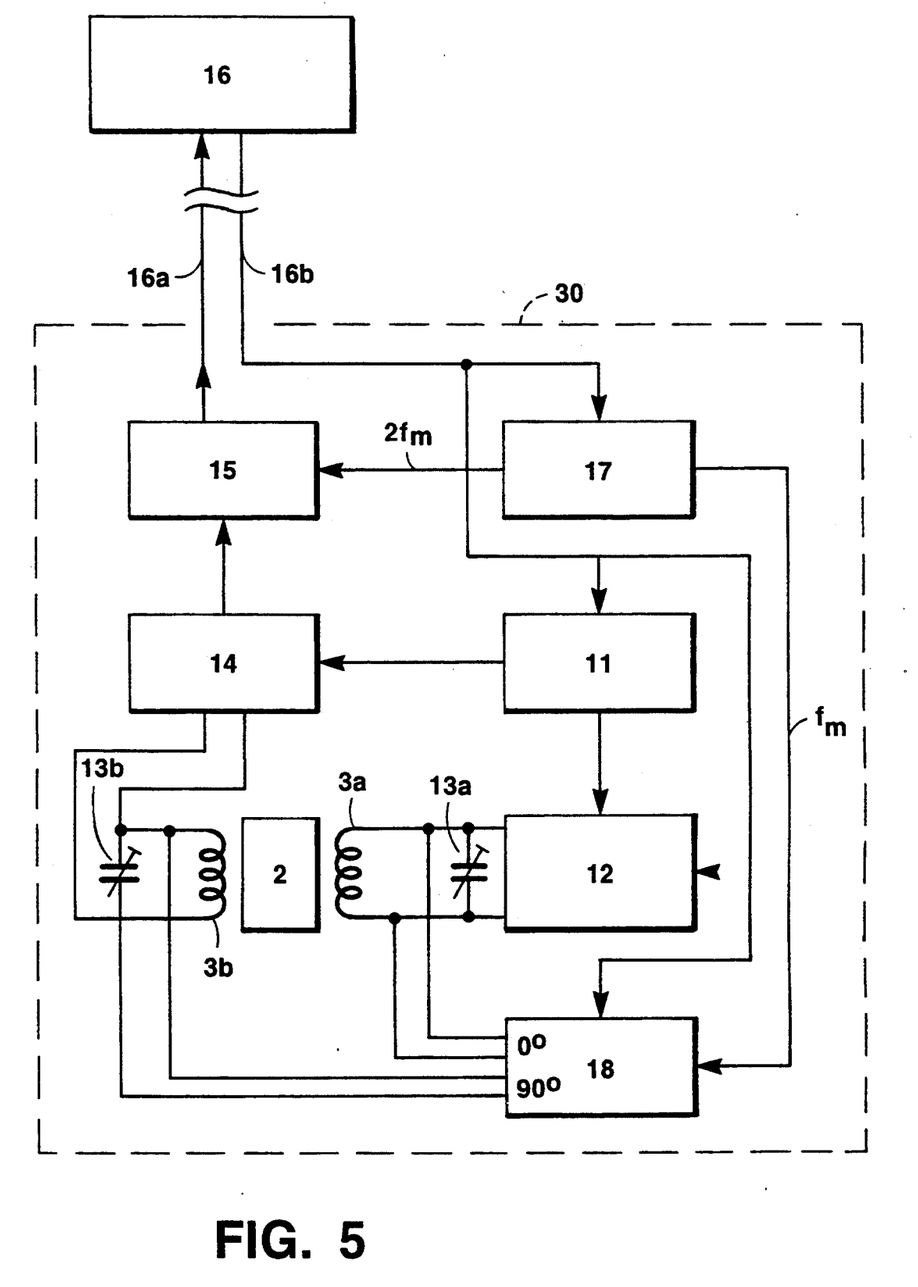
FIG. 5 a schematic circuit diagram of a well logging tool.

In FIG. 5 a circuit diagram is represented schematically for a preferred embodiment of the invention.

A computer (16) serves on the one hand to control the measurement and to store and to process the measuring data. It may partly be integrated into the nuclear resonance well logging tool, however, in general it is located outside the bore hole and is connected to the actual probe only via data lines (16a,b). The components located inside the housing (30) of the well logging tool are framed by a dashed line. These components are also exposed to the extreme environmental conditions as high pressures and temperatures. The pressures reach up to some hundred bars and the temperatures up to about 150° C., occasionally even more than 200° C. The region within the probe housing (30) is generally filled with a fluid which is permanently connected to the surroundings via a membrane (31) to effect pressure equilibrium. The computer (16) controls an RF source (11) which can supply frequency signals in the range around 1 MHz. These signals, in turn, control an RF transmitter (12) and serve as a reference for a phase sensitive detector (14). During the measurement, the transmitter (12) emits a CW broadband excitation signal in the range of the reference frequency onto the excitation coil(s) (3a), said coil(s) being tuned to the excitation frequency band by means of a tuning capacitor (13a). The RF field of the excitation coil(s) (3a) excites nuclear resonance in hydrogen nuclei of the surroundings of the permanent magnet (2) if these nuclei are located in a magnetic field where the resonance frequency of protons is inside the transmitted frequency band. The excited nuclei, in turn, emit RF signals which are detected by means of the detection coil(s) (3b). The detection coils (3b) are largely decoupled from the transmission coils (3a) because of their geometrical orthogonal setup so that to a good approximation no direct signal is detected. (The orthogonal setup is not apparent in FIG. 5). The detection coils(s) (3b) are tuned to the transmitter frequency band by means of a tuning capacitor (13b). The detected nuclear resonance signals are rectified and amplified in a phase sensitive manner by the phase sensitive detector (14). In the embodiment of FIG. 5, a drive unit (18) is controlled by a frequency source (17) with a frequency ($f_m$) in the audio range, in particular in the range between 10 and 20 Hz, which, in turn, is controlled by the computer (16). The drive unit (18) transmits corresponding low frequency drive currents to the transmission and/or detection coils (3a,b), thereby effecting a corresponding low frequency rotation of the permanent magnet (2) around its axes (1). The drive currents through the orthogonal transmission and detection coils (3a,b), respectively, are preferably phase shifted by 90°. In addition, the frequency source (17) supplies the reference frequency $2 * f_m$ to a lock-in-amplifier (15). The rotation of the permanent magnet with the frequency $f_m$ effects a modulation of the nuclear resonance signal with the doubled frequency $2 * f_m$. The output signal rectified by the phase sensitive RF detector (14) is therefore low frequency modulated with $2 * f_m$. It is amplified in a narrow banded and phase sensitive way by the lock-in-amplifier (15) by means of the frequency ($2 * f_m$) supplied by the frequency source (17) and is finally further processed by the computer (16).

As an alternative to the drive by means of the RF coils (3a,b), the permanent magnet may also be rotated by other means, e.g. by separate coils or also in a pneumatic manner, comparable to the sample rotation in analytical NMR spectrometers. The rotation frequency may be measured and controlled e.g. via light barriers.

If the measurement is performed during drilling, the drilling force may advantageously be employed as a drive means for the rotation.

Figure 6:
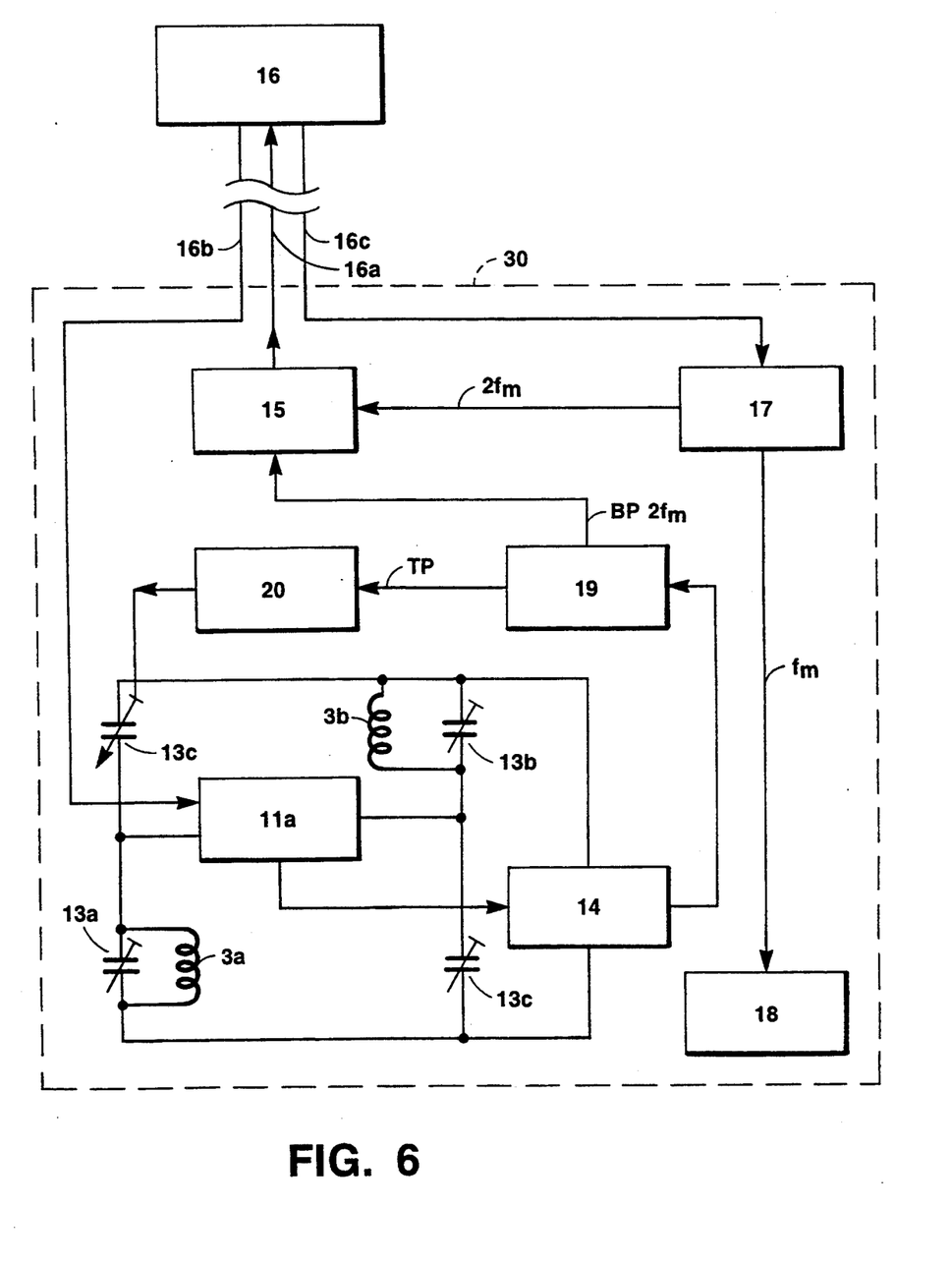
FIG. 6 a schematic circuit diagram of a well logging tool in a bridge configuration.

Finally, FIG. 6 shows an embodiment of the invention in the form of an RF bridge circuit whose balance is continuously controlled. The reference numbers of the components and their function correspond largely to those of FIG. 5. An RF source (11a) with integral transmitter supplies within the frequency band of interest an RF signal to an RF bridge which among other things consists of the transmission and detection coil pair (3a,b) whereby the transmission and detection function is no longer linked to a particular one of both coils. The two arms of the RF bridge are balanced via the tuning capacitors (13a,b,c). This is already done in advance, prior to insertion of the well logging tool into the borehole. However, at least one (13 c) of these capacitors is also still tunable during operation inside the borehole via a tuning circuit. This may be effected mechanically, but preferably by electric means. A phase sensitive RF detector (14) obtains its reference frequency from the frequency source (11a) and detects the difference RF voltage across the arms of the bridge arising from an unbalance of the bridge and rectifies this voltage in a phase sensitive manner. The output of detector (14) reaches a filter or a frequency switch (19), respectively. The slowly varying part of the output signal reaches a null detector (20) via a low pass inside the switch (19) which null detector supplies a control signal for tuning the tuning capacitor (13) in order to keep zero the DC part of the output signal of the RF detector (14) of the bridge. The detector (14) may also be a quadrature detector providing two output signals and thus allowing to determine the unbalance of the bridge with respect to modulus and phase. In this way, two or more tuning components, in general capacitors (13a,b,c), may be tuned within the control circuit in order to keep zero the actually complex deviation signal of the bridge. However, since in general small drifts are involved, e.g. caused by temperature and pressure dependence of the components, which are at least partly known beforehand, good results can also be obtained with a simple detector (14) if the components are correspondingly selected and preadjusted.

In this embodiment, too, the permanent magnet (2) (not shown) is rotated with frequency $f_m$ around its axis (1) by means of a frequency source (17) and a drive (18). In this case the induced difference signal contains the rotation frequency $f_m$. The frequency switch (19) has an output allowing narrow banded passage of frequency $f_m$. This output is connected to a lock-in-amplifier (15) which obtains its reference frequency ($f_m$) also from frequency source (17). In this way, lock-in-amplifier (15) detects exactly that part of the unbalance of the RF bridge originating from the modulation by $f_m$ because of the rotation of the permanent magnet (2) or again also alternatively of the RF coils (3a,b) in relation to the magnet (2). Thereby the bridge is always balanced via the null detector (20) of the control circuit and stays therefore always sensitive. The output signal of the lock-in-amplifier (15) is connected via a data line (16a) to the computer which, on its turn, can control the measurement via further lines (16b,c).

I claim:

1. Well logging tool for insertion into a borehole with an elongated cylinder-shaped permanent magnet which is magnetized perpendicularly to its cylinder axis, to produce a magnetic field outside the borehole, which in an axial range is directed essentially perpendicular to the cylinder axis and whose magnitude in this range depends essentially only on the radial distance from the cylinder axis, with at least one high frequency transmission and detection coil to transmit and to detect high frequency signals for the excitation and the detection, respectively, of proton nuclear resonance signals in material outside the borehole, whereby a high frequency magnetic field which is produced by the transmission coil comprises components which are inside that range perpendicular to the cylinder axis as well as to the magnetic field characterized in that transmission and detection coils are used whose axes are essentially perpendicular to the cylinder axis and perpendicular to each other, that means are provided to apply to the transmission coil a continuous high frequency excitation current with the Larmor frequency of the hydrogen nuclei of the material at a predetermined distance from the cylinder axis, and that the magnetization direction of the permanent magnet is at least intermittently at an angle of about 45° between the axes of the transmission and detection coil.

2. Well logging tool according to claim 1 characterized in that it comprises inside an essentially cylinder-symmetrical housing a high frequency source, a high frequency transmitter, tuning capacitors and a phase sensitive high frequency detector.

3. Well logging tool according to claim 2 characterized in that the permanent magnet is fixed in such a way that its magnetization direction is fixed at 45° between the axes of the transmission and detection coils.

4. Well logging tool according to claim 2 characterized in that the permanent magnet can be rotated around the cylinder axis so that the nuclear resonance signal detected by the detection coil is modulated with a multiple of the rotation frequency of the permanent magnet.

5. Well logging tool according to claim 2 characterized in that the transmission and detection coils magnet can be rotated around the cylinder axis so that the nuclear resonance signal detected by the detection coil is modulated with a multiple of the rotation frequency of the transmission and detection coils.

6. Well logging tool according to claim 4 characterized by a rotation frequency between 10 and 20 Hz.

7. Well logging tool according to claim 4 characterized in that in order to effect the rotation an alternating current of rotation frequency can be applied to the transmission and detection coil.

8. Well logging tool according to claim 4 characterized in that the rotation is effected pnuematically and controlled optically.

9. Well logging tool according to claim 4 characterized in that it comprises a low frequency source and a drive unit for the rotation of the permanent magnet.

10. Well logging tool according to claim 9 characterized in that the transmission and detection coils together with partly tunable capacitors are integrated to an RF measuring bridge which is fed by an RF source and whose output voltage is detected and rectified by a phase sensitive detector whereby the slowly varying part of the output voltage of the phase sensitive detector is connected by a frequency switch to a null detector whose output voltage is used to continuously balance the RF bridge by means of at least one tuning capacitor and whereby the frequency part of the output voltage of the phase sensitive detector in the frequency range of the rotation frequency is connected to a lock-in-amplifier whose reference frequency is derived from the low frequency source for the rotation and that the interior of the cylinder-shaped housing is filled with a fluid and comprises a membrane to effect pressure equilibrium between interior and surroundings.

11. Well logging tool according to claim 1 characterized in that the interior of the cylinder-shaped housing is filled with a fluid and comprises a membrane to effect pressure equilibrium between interior and surroundings.

12. Well logging tool according to claim 9 characterized in that the interior of the cylinder-shaped housing is filled with a fluid and comprises a membrane to effect pressure equilibrium between interior and surroundings.

13. Well logging tool according to claim 10 characterized in that it comprises an essentially cylinder-shaped housing whose interior is filled with a fluid and with a membrane to effect pressure equilibrium between interior and surroundings.

14. Well logging tool according to claim 4 characterized in that the interior of the cylinder-shaped housing is filled with a fluid and comprises a membrane to effect pressure equilibrium between interior and surroundings.

15. Well logging tool according to claim 6 characterized in that it comprises a low frequency source and a drive unit for the rotation of the permanent magnet and that the interior of the cylinder-shaped housing is filled with a fluid and comprises a membrane to effect pressure equilibrium between interior and surroundings.

16. Well logging tool according to claim 3 characterized in that the interior of the cylinder-shaped housing is filled with a fluid and comprises a membrane to effect pressure equilibrium between interior and surroundings.

17. Well logging tool according to claim 5 characterized in that it comprises a low frequency source and a drive unit for the rotation of the transmission and detection coils, that the rotation frequency is between 10 and 20 Hz and that the interior of the cylinder-shaped housing is filled with a fluid and comprises a membrane to effect pressure equilibrium between interior and surroundings.

18. Well logging tool according to claim 5 characterized in that it comprises a low frequency source and a drive unit for the rotation of the transmission and detection coils, that the rotation frequency is between 10 and 20 Hz, that the transmission and detection coils together with partly tunable capacitors are integrated to an RF measuring bridge which is fed by an RF source and whose output voltage is detected an rectified by a phase sensitive detector whereby the slowly varying part of the output voltage of the phase sensitive detector is connected by a frequency switch to a null detector whose output voltage is used to continuously balance the RF bridge by means of at least one tuning capacitor and whereby the frequency part of the output voltage of the phase sensitive detector in the frequency range of the rotation frequency is connected to a lock-in-amplifier whose reference frequency is derived from the low frequency source for the rotation and that the interior of the cylinder-shaped housing is filled with a fluid and comprises a membrane to effect pressure equilibrium between interior and surroundings.

\* \* \* \* \*